(12) United States Patent
Zjajo et al.

(10) Patent No.: US 8,310,265 B2
(45) Date of Patent: Nov. 13, 2012

(54) IC TESTING METHODS AND APPARATUS

(75) Inventors: Amir Zjajo, Eindhoven (NL); Manuel Jose Barragan Asian, Seville (ES); Jose De Jesus Pineda De Gyvez, Eindhoven (NL)

(73) Assignee: NXP B.V., Eindhoven (NL)

( * ) Notice: Subject to any disclaimer, the term of this patent is extended or adjusted under 35 U.S.C. 154(b) by 342 days.

(21) Appl. No.: 12/596,734

(22) PCT Filed: Apr. 30, 2008

(86) PCT No.: PCT/IB2008/051679
§ 371 (c)(1),
(2), (4) Date: Oct. 20, 2009

(87) PCT Pub. No.: WO2008/135917
PCT Pub. Date: Nov. 13, 2008

(65) Prior Publication Data
US 2010/0127729 A1    May 27, 2010

(30) Foreign Application Priority Data
May 2, 2007   (EP) ..................................... 07107300

(51) Int. Cl.
*G01R 31/26* (2006.01)
*G01R 31/3187* (2006.01)
(52) U.S. Cl. ................................ 324/762.01; 324/750.3
(58) Field of Classification Search .. 324/750.01–750.3, 324/762.01–762.09, 754.01–754.3; 438/14–18; 257/48; 714/733–734
See application file for complete search history.

(56) References Cited

U.S. PATENT DOCUMENTS

| | | | |
|---|---|---|---|
| 6,169,442 B1 * | 1/2001 | Meehan et al. | 327/513 |
| 6,191,603 B1 * | 2/2001 | Muradali et al. | 324/750.3 |
| 6,239,603 B1 * | 5/2001 | Ukei et al. | 324/750.3 |
| 6,281,699 B1 | 8/2001 | Bishop | |
| 6,885,700 B1 | 4/2005 | Kim et al. | |
| 6,903,564 B1 | 6/2005 | Suzuki | |
| 7,309,998 B2 * | 12/2007 | Burns et al. | 324/762.01 |
| 2002/0153525 A1 | 10/2002 | Shibayama et al. | |
| 2003/0237025 A1 | 12/2003 | Song | |
| 2004/0148111 A1 | 7/2004 | Gauthier et al. | |

OTHER PUBLICATIONS

Vazquez, Josep R., et al; "Built-In Current Sensor for "Delta"-IDDQ Testing of Deep Submicron Digital CMOS ICS"; VLSI Test Symposium 2004, Napa Valley CA; Apr. 25-29, 2004; IEEE Piscataway, NJ, US; ISBN: 0-7695-2134-7.

* cited by examiner

*Primary Examiner* — Tung X Nguyen

(57) ABSTRACT

An integrated circuit comprises a device under test and embedded test circuitry. The embedded test circuitry comprises a plurality of process monitoring sensors, a threshold circuit for comparing the sensor signals with a threshold window having an upper and a lower limit and a digital interface for outputting the threshold circuit signal. The process monitoring sensors comprise circuitry based on the circuit elements of the device under test. This arrangement enables monitoring of circuit element performance, such as transistor properties, using process monitoring sensors which are embedded with the device under test, so that the same process parameter variations apply to the sensors as to the device under test. The sensors preferably match the physical layout of the device under test.

14 Claims, 10 Drawing Sheets

TABLE I – TEST RESULTS

| $a_0a_1$ | Detector test result | $a_2a_3$ | DLPM test result |
|---|---|---|---|
| '00' | fault | '00' | Fail |
| '01' | correct | '01' | Pass |
| '10' | correct | '10' | Pass |
| '11' | fault | '11' | fail |

IC TESTING METHODS AND APPARATUS

The present invention generally relates to testing of semiconductor integrated circuits, and in particular relates to integrated circuits including integrated testing circuitry, such as BIST (built in self test) circuitry.

One common testing technique for the testing of semiconductor integrated circuits (ICs) is a scan testing technique. This essentially involves launching a test pattern (termed "vector") into the pins of a device package and monitoring an output response at a specific time, dependent on the clock speed of the device. A set of test vectors is used to enable the behaviour of the device under test to be determined. These vectors are designed to enable detection of manufacturing defects in the device.

An Automatic Test Pattern Generator (ATPG) is used to generate the vectors, and provide test patterns for stuck-at faults, transition faults and path delay faults. The testing of digital systems, such as the core logic of an integrated circuit, is typically performed by loading the test pattern into scannable memory elements in the system, launching the test data into the system, operating the system in normal mode for one or more clock cycles of the system clock, and capturing the response of the system to the test stimulus. The test response is extracted from the system and is compared with the response which should have been obtained if the system was operating according to design. The scanning of test patterns is carried out in so-called "shift cycles" whereas the system operation to test the system response is carried out in so-called "normal mode cycles".

To improve test coverage of individual circuits, DFT (Design for Test) tools have been developed to embed test circuitry into the System on Chip (SoC). For example, Built-In Self-Test (BIST) circuitry may be embedded in the IC design to test individual circuit blocks. Each core and sub-core embedded on a System on Chip includes its own test input and output ports and needs to be tested individually, without interference from adjacent cores. So-called wrapper cells are attached to the functional elements of a core to provide paths for the test data to flow. The test ports form part of the wrapper cell, which can operate in a transparent functional mode or in a test mode.

With the increased complexity of VLSI circuits and the reduced access to internal nodes, the task of properly testing these devices is becoming a major bottleneck. The large number of parameters required to fully specify the performance of mixed-signal circuits and the presence of both analog and digital signals in these circuits make the testing expensive and time consuming task. Design for Testability (DfT) and Built in Self Test (BIST) techniques are aimed at increasing observability and controllability so as to reduce test cost and improving test quality. However, even with BIST and DfT, the test methods for analog circuits still rely on specification testing, in which some or all response parameters are checked for conformity to the design specifications. This specification testing is time consuming and hence, also expensive.

According to the invention, there is provided an integrated circuit comprising a device under test and embedded test circuitry, wherein the embedded test circuitry comprises:
 a plurality of process monitoring sensors;
 a threshold circuit for comparing the sensor signals with a threshold window having an upper and a lower limit;
 a digital interface for outputting the threshold circuit signal,
 wherein the process monitoring sensors comprise circuitry based on the circuit elements of the device under test.

This arrangement enables monitoring of circuit element performance, such as transistor properties, using process monitoring sensors which are embedded with the device under test, so that the same process parameter variations apply to the sensors as to the device under test. The sensors preferably match the physical layout of the device under test.

The sensors preferably match the device under test in terms of the component sizes, physical layers making up the components and possibly orientation over the substrate. This matching assures that the sensors and the original structures in the DUT both have the same behavior under process variations, which simplifies the measurements.

The process monitoring sensors are thus preferably extracted from selected structures in the DUT. This selection, although easily generalized, relies on the knowledge and analysis of the DUT itself, so the resulting DLPM circuits and reference voltages are related to the DUT specifications and performance figures under study.

This approach effectively identifies a common source of static errors (e.g. component mismatch in the implementation caused by process parameter variations) and then enables decisions to be made based on the finding. In other words, the primary error sources in the circuit are found, and for every error source, a sensor in the form of a die level process monitor ("DLPM") is defined, which is based on a copy of part of the original circuit element of the DUT which provided the error source. By extracting the DLPM circuit from the DUT itself, the DLPM circuit accomplishes some desirable properties: i) it is designed to maximize the sensitivity of the circuit to the target parameter to be measured, ii) it matches the physical layout of the extracted device under test, iii) it is small and stand alone, and consumes no power while in off state, and iv) the design of DLPM is flexible enough to be applied in several ways depending on the system-on-chip to which it is added.

The invention thus provides an alternative to BIST, in the form of die-level process monitoring (DLPM) structural testing. Extra circuitry is used to perform an operational test, which is targeted to detect circuit malfunctioning and to assure, up to some extent, that specifications are fulfilled without actually measuring functional parameters. This test approach can be less costly and of great importance for easy and fast testing of analog circuits malfunctions, for increasing observability and controllability and for detecting catastrophic and parametric faults.

The system of the invention does not replace traditional specification-based tests, but uses monitoring of on-chip process deviation to enable provision of a reliable and complementary method to quickly discard faulty circuits in wafer and final tests without testing the complete device. Such a test method can reduce the cost associated with production tests, since this early detection of the faulty circuits avoids running an important fraction of traditional tests.

Detecting faulty devices at the wafer level has the additional advantage that packaging costs (which represent 25% of the total system cost) can be avoided.

Thus, the invention provides on-chip process deviation monitoring to allow the early identification of faulty circuits, providing valuable information, which can be used to guide the test and even allow the estimation of selected performance figures. The information obtained through guiding and monitoring process variations can be re-used and supplement the circuit and/or process calibration. By deriving the process variation sensing circuit from the actual DUT implementation, the behaviour of the DUT can be accurately mimicked.

The sensor information can also be used for guiding the "nominal" test strategy used for subsequent full testing of a chip, for example by setting up test limits.

The sensor is preferably designed to maximize the sensitivity of the sensor circuit to a target parameter to be measured.

The sensors are preferably embedded into the integrated structure of the device under test and/or provided around the periphery of the device under test. The sensors are preferably for monitoring process parameter variations.

The embedded test circuitry may comprise digital control logic for interface to external test circuitry, the digital control logic accessing a scan chain of the embedded test circuitry. This allows external test circuitry to run a test using the sensors in conventional manner. The system also then enables easy post-processing of process variation data.

The process monitoring sensors are driven independently of the device under test. This means that there is no extra circuit load present as a result of the test circuitry in the analog signal path. For example, the process monitoring sensors are not functionally connected to the device under test, but instead monitor process parameters which apply to the device under test. The sensors and the DUT are completely independent with no connections between them.

The digital interface preferably provides sampling and digitization of the threshold circuit signal. The process monitoring sensors, the at least one amplifier and the threshold circuit may each comprise circuitry based on and the circuit elements of the device under test.

The sensor can be made small and stand alone, and can consume no power while in off state. There is also the possibility to design the sensors in a flexible way depending on the system-on-chip to which it is added.

The system can be easily applied to IC, SiP or board level.

The invention also provides a method of testing an integrated circuit, comprising analysing embedded test circuitry associated with a device under test, wherein the embedded test circuitry comprises a plurality of process monitoring sensors (14) which comprise circuitry based on the circuit elements of the device under test, a threshold circuit (22) for comparing the sensor signals with a threshold window having an upper and a lower limit, a digital interface (17) for outputting the threshold circuit signal, wherein the method comprises monitoring process parameter variations using the embedded test sensors independently of the operation of the device under test.

Examples of the invention will now be described in detail with reference to the accompanying drawings, in which.

From a circuit design perspective parametric process variations can be divided into inter-die and intra-die variations. Inter-die variations such as the process temperature, equipments properties, wafer polishing, wafer placement, etc. affect all transistors in a given circuit equally. For the purposes of circuit design, it is usually assumed that each component or contribution in inter-die variation is due to different physical and independent sources; therefore, the variation component can be represented by a deviation in the parameter mean of the circuit. Intra-die variations are deviations occurring within a die. These variations may have a variety of sources that depend on the physics of the manufacturing steps (optical proximity effect, dopant fluctuation, line edge roughness, etc.) and may lead to significant errors in analog circuit applications. For example, inter-die variation has little effect on circuit variability of a current mirror with a constant bias, while intra-die variations can cause significant offset in the value of the mirrored current.

The invention relates to integrated circuits with embedded test circuitry, wherein the embedded test circuitry is used to analyse process parameters. Process monitoring sensors use circuitry based on the circuit elements of the device under test, so that they can be used to estimate the process variations affecting the device under test, without performing full testing of the device under test.

One example of particular benefit is for the testing of complex analogue integrated circuits, such as analogue to digital circuits (ADC). Although several attempts have been made to alleviate increasing test difficulties of ADC testing, none of these methods provides the possibility for early identification of excessive process parameter variations. Analytic approaches to test a set of parameters for ADCs based on Walsh functions and Wavelet transforms require a computing core for their complex computation when the system is integrated on a chip. On-chip delta-sigma DACs for sine wave generation and DSP techniques for data analysis have also been proposed. However, the techniques require both intensive computation and on-chip ADC and DAC.

The built-in sensor provided in the system of the invention measures and evaluates the variation of process parameters, which enables the efficient development of test patterns and test methods, as well as ensures good yields.

For identical transistors it has been observed that, within a chip, the variation of transistors parameters has a random distribution. Measurement of these fluctuations is paramount for stable control of transistor properties and statistical monitoring. The evaluation of these effects enables the efficient development of the test patterns and test methods, as well as ensures good yields.

Figure 1A:
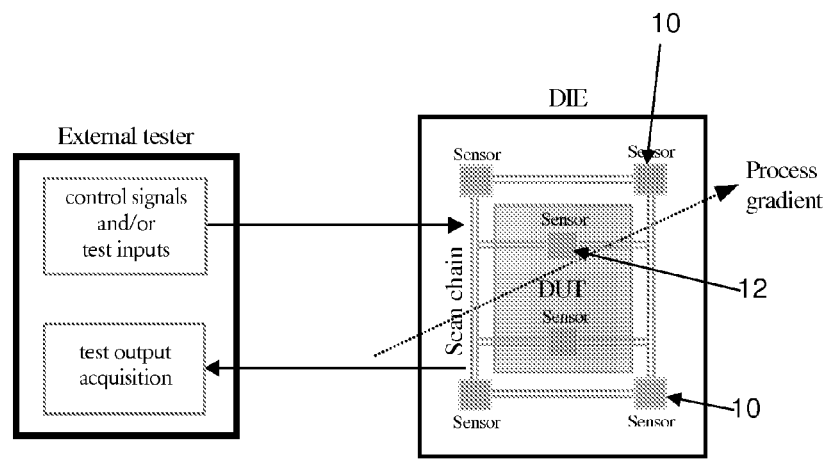
FIGS. 1a and 1b show schematically an example of the test arrangement of the invention.

FIG. 1a depicts the proposed test strategy block diagram. In one example, a family of built-in process variation sensing circuits 10 is placed (at least) at each corner of the device under test. It is also possible to embed sensors 12 in the DUT. This location maximizes the sensing capability of process variations due to process gradients. Depending on the size of DUT, additional sensors can be placed in and around the DUT to provide additional statistical information.

Figure 1B:
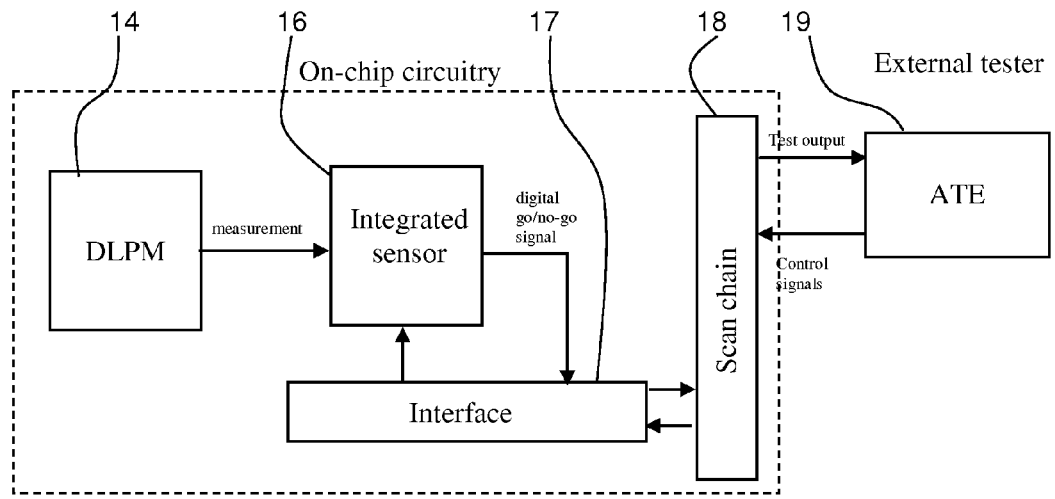

FIG. 1b shows a simple block diagram of the sensor, which comprises a die level process monitoring circuit (DLPM) 14, a sensor 16 for generating a digital analysis signal, an interface 17, and a scan chain 18. The scan chain 18 interfaces with the external test circuitry 19, and receives control signals, and outputs the test output.

Figure 2:
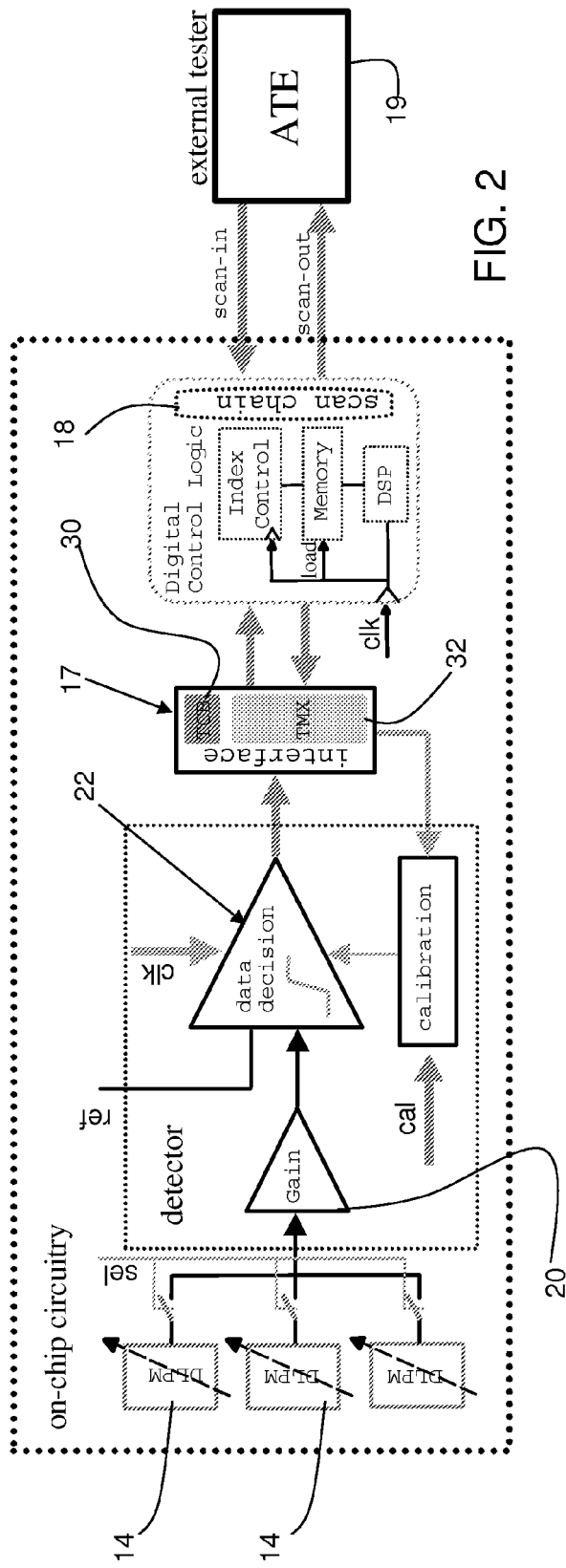
FIG. 2 shows the embedded test circuit in more detail.

An example of the proposed built-in sensor is illustrated in FIG. 2 and consists of die level process monitor circuits (DLPMs) 14, an amplifier 20, which isolates the test circuit from the DLPM, and a programmable data decision circuit 22 to detect the excessive process parameter variations. The analog decision is converted into pass/fail (digital) signals through the circuit 22. The interface circuitry 17, which could be implemented through CTAG.AMS, allows the external controllability of the test, and also feeds out the decision of the detector to a scan chain 18. The test control block (TCB) 30 selects through a test multiplexer (TMX) 32 the individual DLPM measurement. Select, reference and calibration signals are offered to the detector through this interface circuitry. Digital control logic can be inserted on the chip or implemented externally.

The DLPM circuits can be extracted from selected structures in the DUT. This selection, although easily generalized, relies on the knowledge and analysis of the DUT itself, so the resulting DLPM circuits and reference voltages are related to the DUT specifications and performance figures under study. The information obtained through guiding and monitoring process variations can be re-used and supplement the circuit and/or process calibration.

Figure 3:
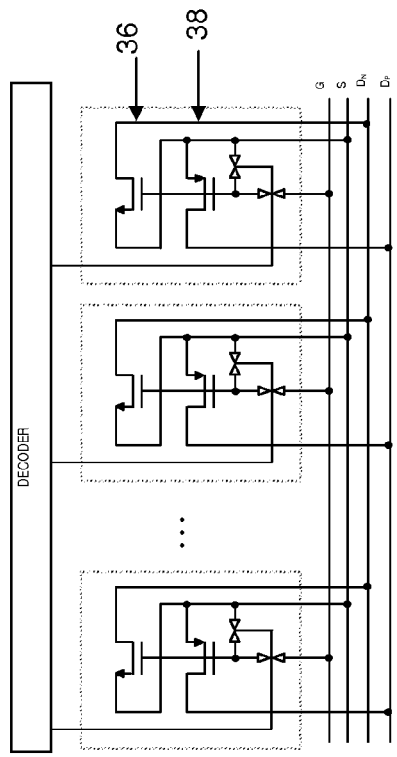
FIG. 3 shows an example of monitoring circuit.

Alternatively, DLPM circuits can be designed as an array of transistor pairs, each of different sizes as illustrated in FIG. 3. One pair of the nmos 36 and pmos 38 transistors is selected through the internal decoding/selection circuitry. Loading for each transistor pair can be extracted from the DUT or set independently.

The arrangement of FIG. 3 can be used for process monitoring and/or process calibration, which, in an indirect way, may be used also to extract information about the original DUT. This DLPM represents a basic monitoring circuit. The measurement of the transistor parameters can be implemented in a number of ways. One possibility is to apply to the transistor a non-zero gate-source voltage, and measure the drain currents. Repeating this at different locations in the die, it is possible to relate the differences between the measured currents and the process variations across the die.

The data decision circuit 22 compares the output of the die level process monitor against a comparison reference window, whose voltage values (corresponding to the required LSB values) are selected from the reference ladder or set externally. The reference voltages defining the decision windows are related to the DUT specifications and performance figures under study. By sweeping the reference voltage until a change in the decision occurs, it is possible to detect the tolerance of the DLPM under test, which in turn is a "mirror" of the actual circuit component in the DUT. This information can be used to assess whether the whole DUT is likely to be faulty, or to adjust the test limits in the ATE to test the DUT.

Figure 4:
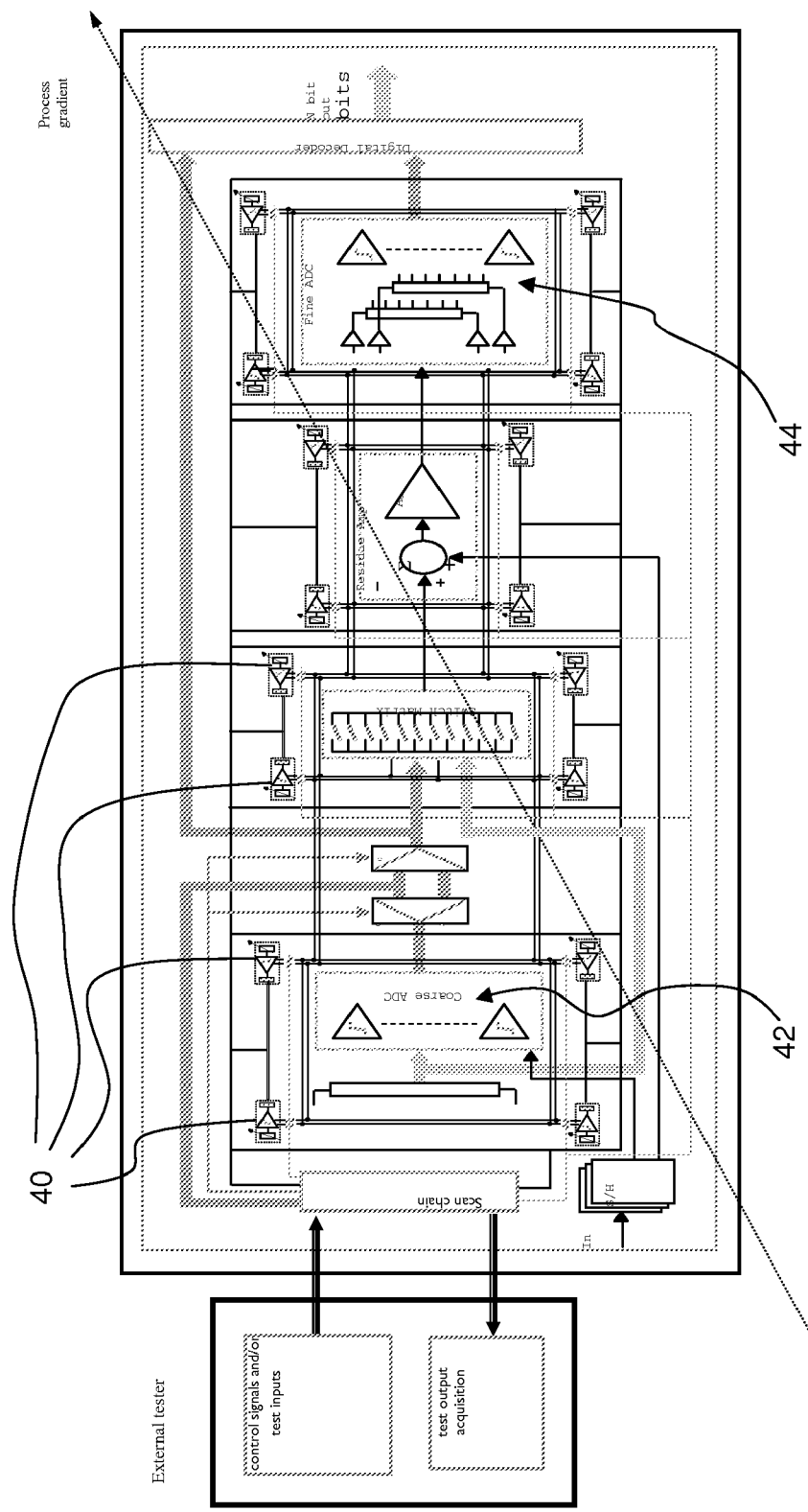
FIG. 4 shows an ADC circuit divided into partitions each having test circuitry.

FIG. 4 depicts the proposed test strategy block diagram applied to a multi-stage ADC. A family of built-in sensors circuits 40 is placed (at least) at each corner of the partitioned device under test. Depending on the size of the partitioned DUT, additional sensors can be placed around to increase the statistical mass. The ADC comprises a coarse ADC 42 and a fine ADC 44. The coarse ADC is to quantize the coarse bits (or MSB, most significant bits) and the fine ADC is to quantize the fine bits (or LSB, least significant bits).

Figure 5:
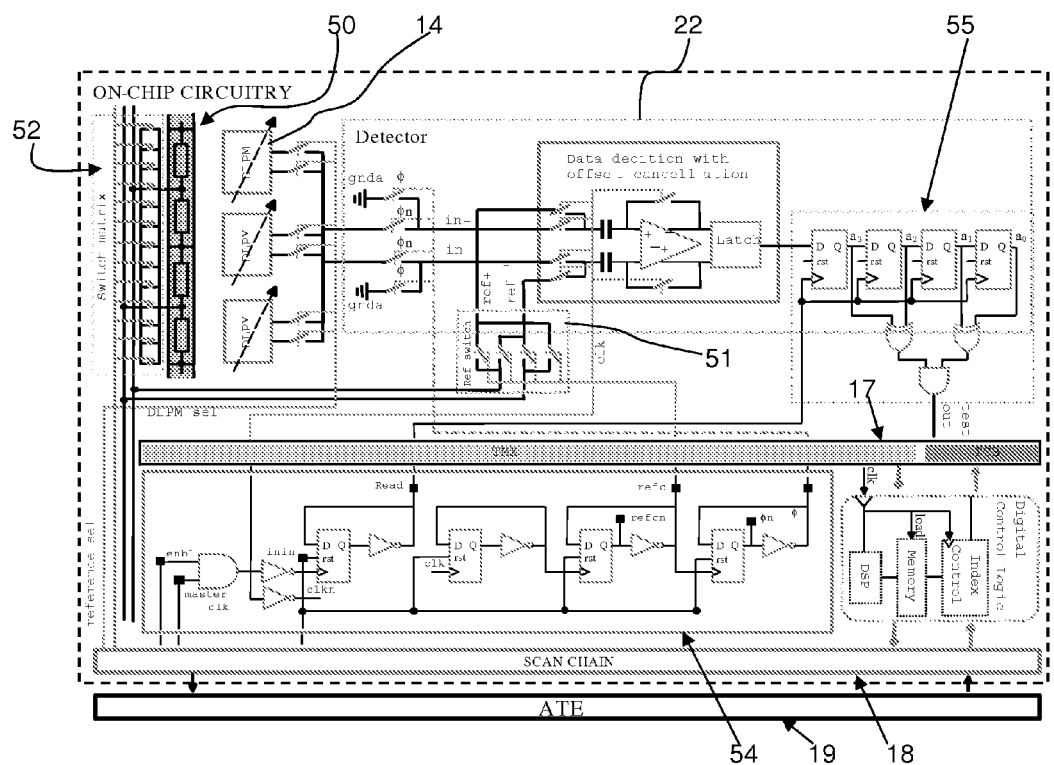
FIG. 5 shows the embedded test circuit and other on-chip circuitry in more detail.

FIG. 5 shows an example of the complete test scheme including the DLPM circuits 14, detector/decision circuit 22, reference ladder 50 and the switch matrix 52 to select the reference levels for the decision window. The reference window is in this way tunable, so that multiple tests can be used to extract different process parameter information. As shown, a selected pair of signals from the reference ladder 50 are switched through switch 51 to the decision circuit 22.

The interface 17 to external circuitry is also shown, as well as the control block 54 to sequence events during test, the scan chain 18 to transport the pass/fail decision, and the external tester 19. The control block 54 performs a frequency dividing function.

Figure 6:
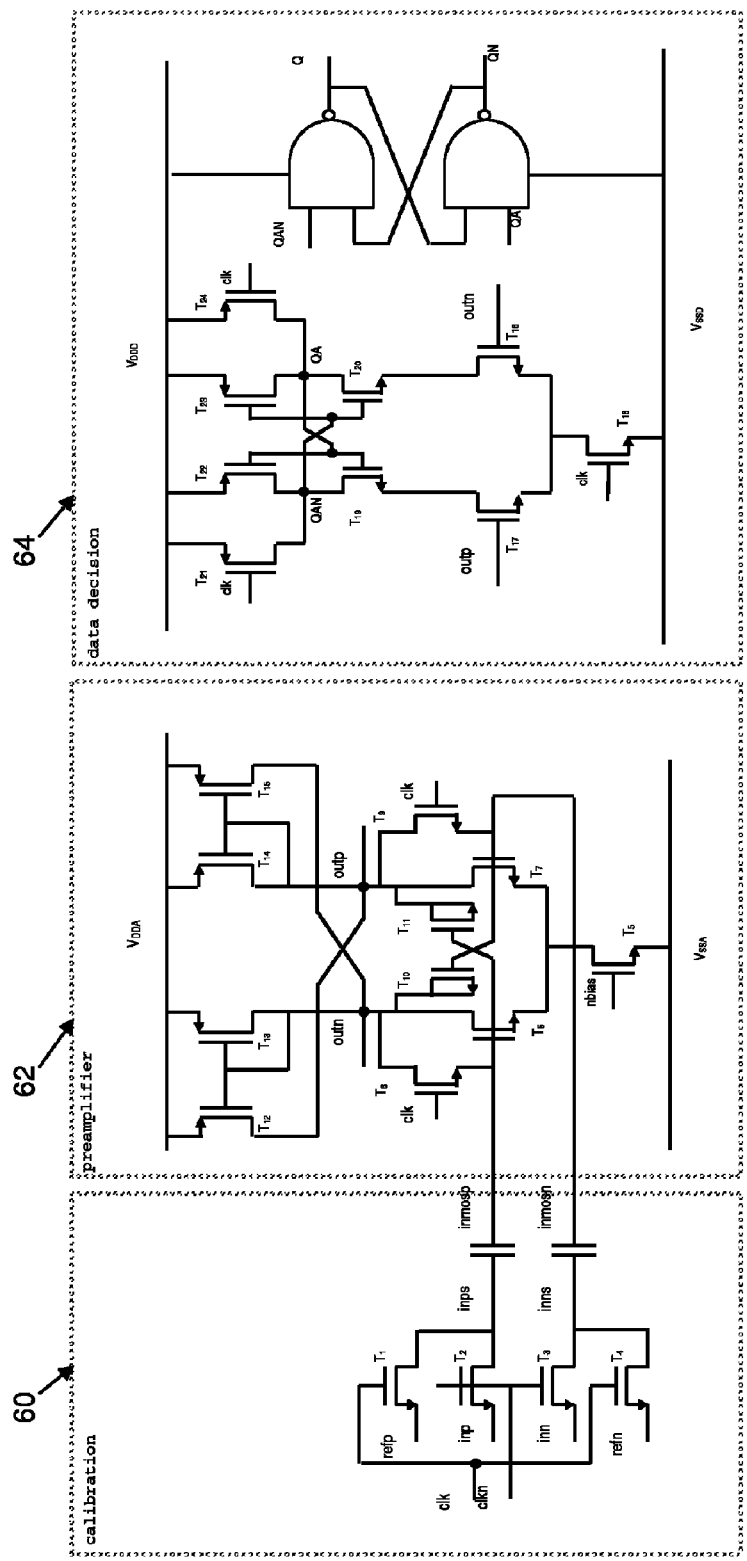
FIG. 6 shows an example of suitable circuits for the sensor circuit.

FIG. 6 shows an example of possible circuits used for the amplifier and data decision stages of the sensor together with an autozeroing scheme to cancel a possible sensor offset.

The circuit comprises a calibration stage 60, a preamplifier 62 and a data decision circuit 64.

The calibration stage 60 is provided to evaluate offsets. The comparison references needed to define the decision windows for faulty and good circuits can be controlled through the DC signals labelled refp and refn in FIG. 6.

The calibration, amplifier and data decision stages are based on circuitry extracted from a coarse ADC comparator, so that the test circuitry is based on the circuitry forming the device under test.

In particular, the circuits are based on the comparators used in a coarse ADC.

DLPM testing is based on a pass/fail condition of a window rather than on a single threshold. In contrast to single threshold decisions, testing against a decision window requires differential measurements. Due to the differential nature of the measurements, two runs with interchanged detector references are needed in each test to ensure a proper pass/fail decision. This double-measurement protocol allows the definition of a pass/fail window, instead of a single pass/fail level. Since the result of each run is a digital 1-bit signal, the computation of the test result can be implemented either on-chip adding some simple logic to the detector, or off-chip using resources located in the tester itself.

Two runs $m_{t1}(i)$ and $m_{t2}(i)$ are needed with interchanged data decision circuit references, consisting of two thresholds $m_{t1,2l}(i)$ (the lower threshold defined by the two runs 1,2) and $m_{t1,2r}(i)$ (the upper threshold defined by the two runs 1,2). A left (lower) threshold is denoted by "l" and an upper (right) threshold is denoted by "r". If a test is successful, the measurement point plus uncertainty due to noise, $m_{t1,2}(i)+\zeta$, will lie within the range given by $(m_{t1,2l}(i), m_{t1,2r}(i))$, where $\zeta$ is the uncertainty due to noise. As a result, the following inequalities hold, $$m_{t1,2l(i)} \leq m_{t1,2(i)} + \zeta \leq m_{t1,2r(i)}$$

$$m_{t1,2l(i)} - \max(\zeta) \leq m_{t1,2(i)} \leq m_{t1,2r(i)} - \min(\zeta) \quad (1)$$

Assuming noise $\zeta$ falls in the range of $(-\Delta, \Delta)$, $m_{t1,2}(i)$ satisfies the following inequality detection thresholds in the presence of measurement noise:

$$m_{t1,2l}(i) - \Delta \leq m_{t1,2(i)} \leq m_{t1,2r}(i) + \Delta \quad (2)$$

The reference voltages defining the decision windows are related to the DUT specifications and performance figures under study. By sweeping the reference voltage until a change in the decision occurs, information about the process variations can be extracted. The performance of the detector in terms of resolution and robustness against process variations is a major concern for the intended application. The robustness against process variations is provided by an auto-zeroing scheme. If a better resolution is required, the efficiency of this auto-zeroing can be improved, at the expenses of area overhead, by increasing the value of the input capacitors and/or the preamplifier gain. However, the auto-zeroing scheme does not assure the functionality of the comparator.

For instance, a stuck-at fault affecting the output memory element will not be corrected and it will result in a faulty detector. By this reason, a previous test stage to test the detector functionality has to be added to the test protocol.

Figure 7:
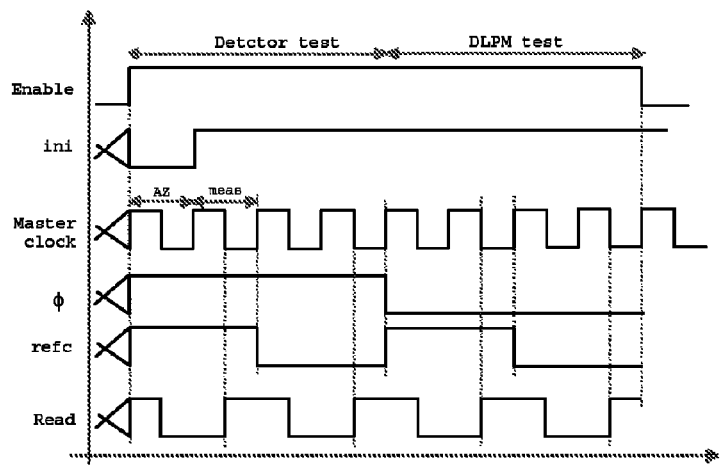
FIG. 7 is a timing diagram for a test procedure.

FIG. 7 illustrates the timing diagram of the required control signals (external and on-chip generated). The functionality of the circuitry can be described as follows:

While the Enable signal is high, the system enters a test mode. In the test mode, two main phases can be distinguished according to the state of a phase signal φ. If φ is high, the inputs of the detector are shorted to analog ground to perform a test of the detector itself, whereas if φ is low the particular DLPM is connected to the detector and tested. Each of these phases takes four Master clock periods, two with the reference signal set to the upper limit of the comparison window and the other two with the reference ("refc") set to the lower limit. During the detector auto-test, the change of the reference should cause the output to change state, since the input is set to zero.

The signal "ini" initializes the flip-flops which make up the frequency dividers which generate the control signals. These frequency dividers are shown in FIG. 5 as 54.

The values a0, a1, a2, and a3 are the test outputs, and they are read out and stored in the output flip flops labeled 55 in FIG. 5 The test inputs are the references for the comparisons, the clock, the enable signal and the ini signal. The clock signal, enable signal and initializing signal "ini" are provided to the control block 54, and this generates the signals Φ, refc and read.

When Φ is high, the sensor itself is pre-tested, and the results of this "pre-test" are the digital values a0 and a1.

When Φ is low, the DLPM is tested, and the results of this test are the digital values a2 and a3.

Signals refc and read control the references for the decision stage and the storage of the results in the output flip-flops 55, respectively. The 8 possible test outputs, a0a1a2a3, and their meanings (pass/fail) are in the table shown in FIG. 7

This provides a quick and easy proof of the functionality of the detector. During the DLPM test, the output of the DLPM is sequentially compared with the references to determine whether the measurement is inside the expected window or not. In both cases, a simple shift register triggered by the signal labeled Read acquires the detector output.

Figure 8:
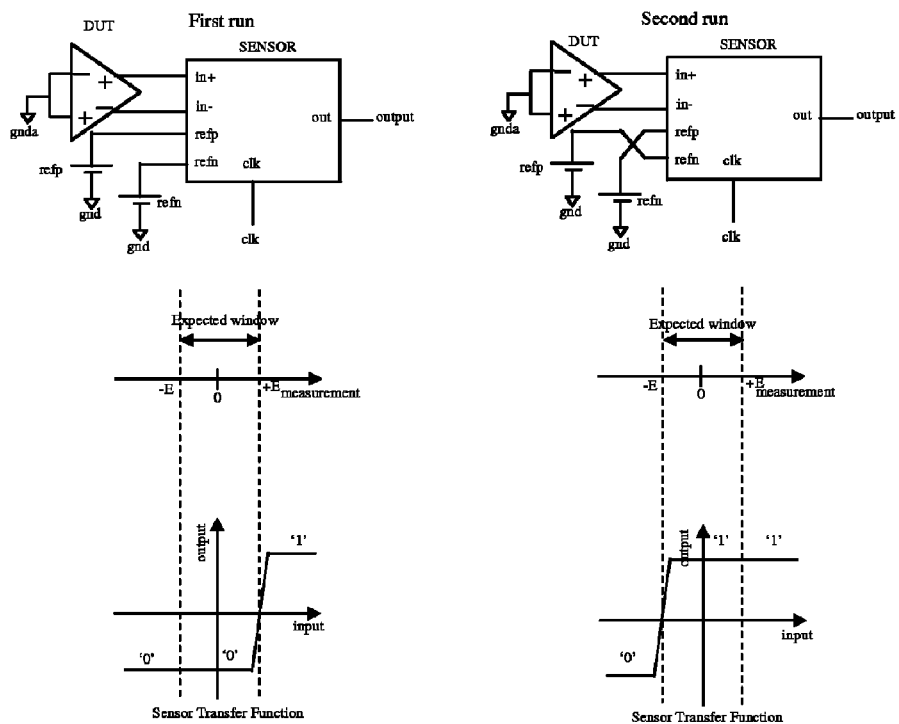
FIG. 8 is used to explain that two test runs are carried out to define a test window.

FIG. 8 illustrates the tolerance window generation along with the sensor functionality.

FIG. 8 shows the sensor configured with one threshold for the first run and a different threshold for the second run. As shown, the reference voltages are swapped between the positive and negative reference inputs between the two runs. In each test, the output of the DLPM is compared with two references, in a sequential way: firstly one comparison with the lower reference, and then another comparison with the upper one.

The rising edges of the read signal are located at the 'hold' state of the detector. Thus, it is assured that the output of the detector is stable when the read signal activates its storage in the memory element 55 (FIG. 5). The test output will be a 4-bit signal, labeled $a_0 a_1 a_2 a_3$, which codifies the four different states. As can be deduced from the Table in FIG. 7, the overall result of the test is given by $$\text{Test result} = (a_0 \oplus a_1) \ \& \ (a_2 \oplus a_3) \quad (3)$$

This test result can be computed either on-chip in a DSP unit, as depicted in FIG. 5 as 55, or off-chip. Once the result is available (either the test result itself or the 4-bit number $a_0 a_1 a_2 a_3$ without processing) it can be fed to a scan chain scheme for its later extraction. The control signals related to the scan chain are not shown in the timing diagram. In addition, it is important to remark that the system features an additional test mode to test all the flip-flops used in the test scheme. This mode is not represented for simplicity.

When the test mode is activated, the flip-flops are isolated from the rest of the circuitry and connected together as a shift register. Additional test input/output for this purpose are also available.

A 'pass' DLPM test event denotes the measurement inside the comparison window, while a 'fail' DLPM test event is obtained with a slightly narrower comparison window. At the end of the evaluation time the test output is a go/no-go digital signal, which combines the result of the detector test and the DLPM test. Note that the implementation of the clock generation circuitry needs a control signal to set the initial conditions in the D-flip-flops to a known value. This signal can be externally or internally generated, for instance it can be triggered by the rising edge of the enable signal.

All the flip-flops used are scannable and there is a flip-flop test enable signal for that purpose.

It will be apparent from the general description above that the invention facilitates fast identification of excessive process parameter variations in production tests without testing the complete device, making possible early identification of faulty circuits and providing valuable information, which can be used to guide the test and even allow the estimation of selected performance figures.

Economic considerations are only one of the advantages of providing die-level process variation observability. Other advantages include increased fault coverage and improved process control, diagnostic capabilities, reduced IC performance characterization time-cycle, simplified test program development and easier system-level diagnostics.

To illustrate the proposed methodology in more detail, the multi-step ADC shown in FIG. 4 will be analysed in more detail.

The performance measures of an ADC can be divided into two groups, dynamic and static measures. The dynamic performance is determined by signal and frequency dependent errors such as non-linear slewing, clock feedthrough, glitches, settling errors, etc., while a common source of static errors (offset, gain and linearity errors) is component mismatch in the implementation caused by process parameter variations.

The static parameters are determined by the analog errors in various ADC components. Therefore, a major challenge in ADC test is to estimate the contribution of those individual errors to the overall ADC linearity parameters. If timing errors are not considered, the primary error sources present in a multi-step ADC are decision stage offset voltage errors, stage gain errors and errors in the internal reference voltages. Each of the three types of errors defined above is the combined result of two physical effects:

(i) noise, which includes charge injection noise in analog switches, thermal noise, shot noise, flicker noise, and noise coupled from digital circuitry (via crosstalk or substrate), and (ii) on-chip process parameter variation, e.g. device mismatch.

The offset errors include offset caused by either component mismatch, self heating effects, comparator hysteresis or noise. The gain error group includes all the errors in the amplifying circuit, including technology variations and finite gain and offset of the operational amplifier.

Figure 9:
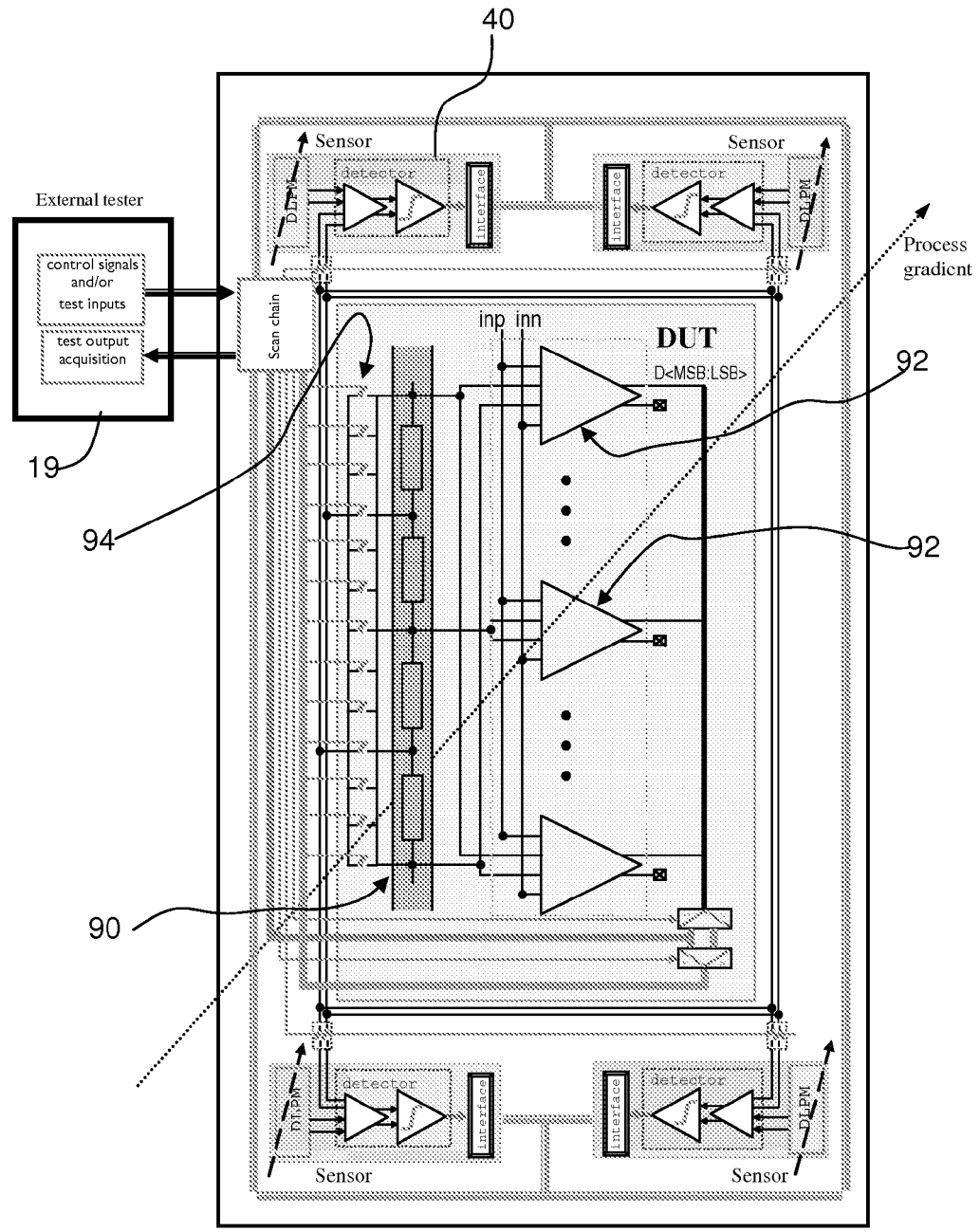
FIG. 9 shows a coarse ADC with an embedded test circuit of an example of the invention.

FIG. 9 shows one part of the two-stage ADC shown in FIG. 4, namely the coarse ADC. The coarse (flash) ADC shown in FIG. 9 consists of resistor reference ladder 90 and comparators 92 (having circuit layouts corresponding to the comparator circuit shown in more detail in FIG. 6 used for the sensor) to make a decision if the voltage of the input signal is lower or higher than the voltage present on the resistor reference ladder. A switch matrix 94, controlled through scan chain, selects reference signals for the sensors. FIG. 9 shows four sensors 40 in the corners, and the main device under test (DUT) in the centre.

From an analysis of the coarse ADC of FIG. 9, it is evident that the main causes of static errors (caused by parameter variations) are resistor ladder offset, comparator offset and gain mismatch (offset). Therefore to mimic the DUT behavior, three different DLPMs can be derived:

- a reference ladder DLPM, where the circuit senses the mismatch between two of the unit resistors used in the actual resistor ladder design. The current that flows through the resistors (whose values are extracted from the ladder itself) is fixed using a current mirror. The voltage drop over the resistors is a measurement of the mismatch.
- a gain-based DLPM, based on the comparator circuit shown in FIG. 6.
- a decision stage-based DLPM, again based on the comparator circuit shown in FIG. 6.

The last two circuits are extracted (replicated) from the circuits (amplifiers, comparators) of that particular part of the DUT, which they are meant to observe. To calculate individual sensor comparison windows, it is assumed that the ADC can be regarded as an approximately linear system.

Figures 10A, 10B, 10C:
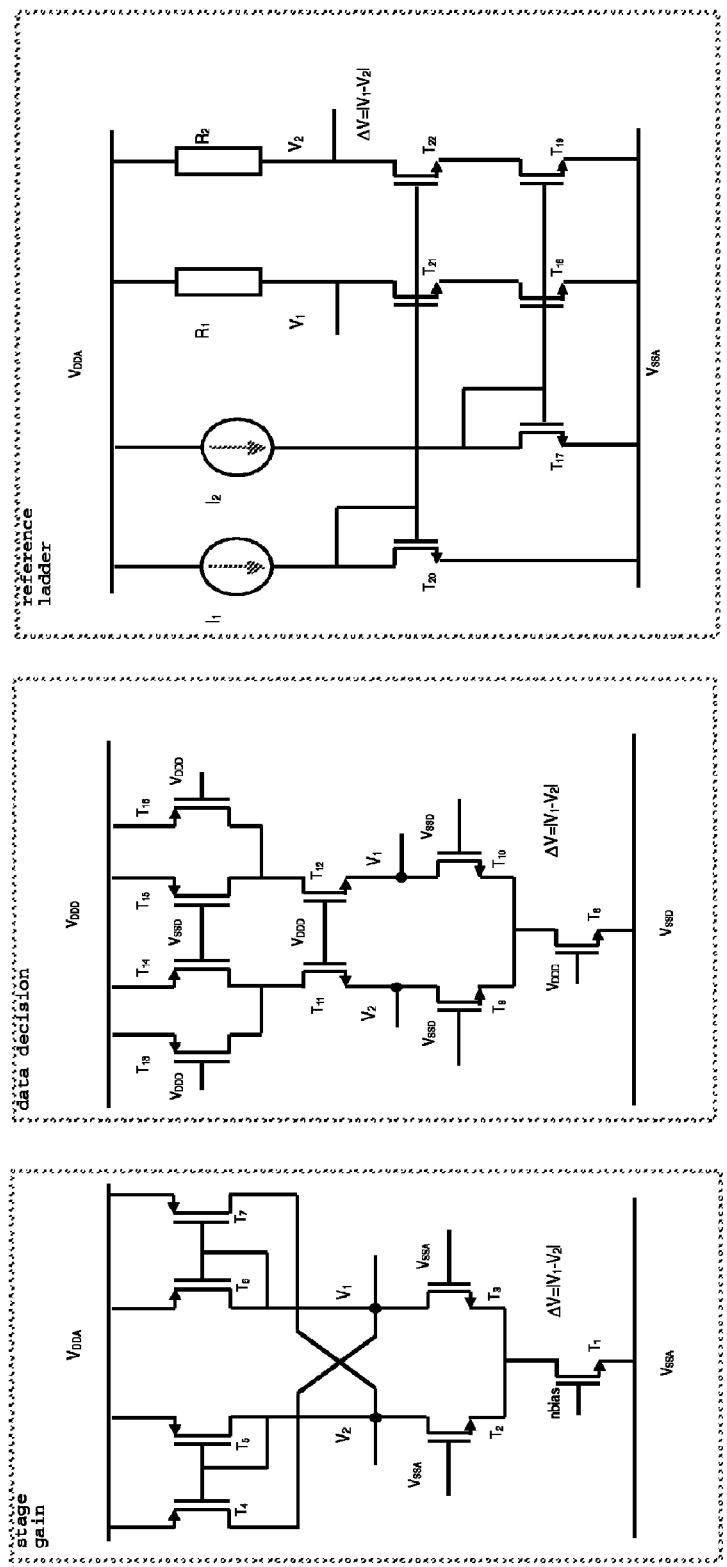
FIG. 10 shows examples of sensor circuits for use in the circuit of FIG. 9.

The resulting circuits are shown in FIG. 10, with the reference ladder DLPM shown in FIG. 10c, the data decision DPLM shown in FIG. 10b and the gain stage DLPM shown in FIG. 10a. FIG. 10 thus shows possible types of DLPMs based on the actual structures of the ADC.

The reference voltage errors are caused by resistor ladder variations and noise, as well as by errors in the switch matrix, which are mainly due to charge injection in the CMOS transmission gate. By monitoring of on-chip process parameter deviation (such as threshold voltage, current gain), valuable information is provided, which can be used to guide the test and allow the estimation of selected performance figures. The information obtained through guiding and monitoring process variations can be re-used and supplement the circuit and/or process calibration.

The reference voltages defining the decision windows are related to the DUT specifications and performance figures under study. For a proper definition of the comparison window, the digital correction and the offset cancellation implemented in the actual design have to be taken into account.

By extracting the DLPM circuit from the DUT itself, the DLPM circuit accomplishes some desirable properties:
  i) it is designed to maximize the sensitivity of the circuit to the target parameter to be measured,
  ii) it matches the physical layout of the extracted device under test,
  iii) it is small and stand alone, and consumes no power while in off state, and
  iv) the design of DLPM is flexible enough to be applied in several ways depending on the system-on-chip to which it is added.

As shown above, three generalized strategies can be extracted from the DLPM circuits: gain stage-DLPMs, decision stage-DLPMs, and resistor ladder-DLPMs.

Gain stages, such as the residue amplifiers in the ADC, can be tested using the same strategy developed for testing the preamplifier in the coarse ADC. The proposed methodology can be directly translated to any gain stage, allowing the detection of mismatch issues through the measurement of output offset.

Decision stages in the ADC can be tested via adapting the proposed decision stage DLPM strategy to each particular design. This strategy is based on breaking the regeneration feedback in the latch, and then sensing process mismatches through the measurement of output offset.

Internal reference voltages can be tested adapting the same scheme proposed for the resistor ladder DLPM, which gives a measurement of resistor mismatching through the measurement of a voltage drop.

By sweeping the reference voltage until a change in the decision occurs, information about the process variation can be extracted. By sweeping a reference until a transition occurs at the output, the transition point is a direct measurement of the effect of the process variation.

To employ the test method to evaluate the DUT, discrimination windows for various DLPMs are defined according to the rules of the multi-step ADC error model.

Figure 11A:
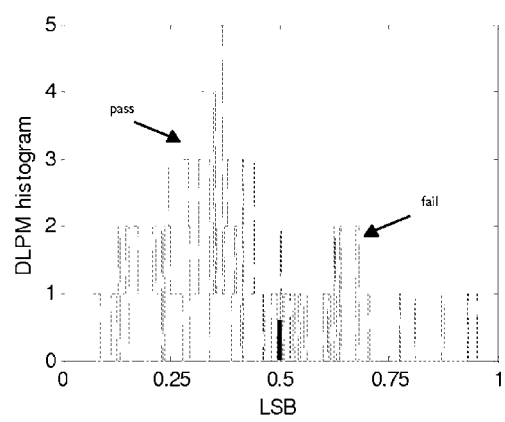
FIGS. 11a and 11b show test results graphically.

In one example, a total of 125 DLPMs can be been placed in and around the partitioned DUT with results shown in FIG. 11a. Variations of 105 DLPMs fall inside the discrimination window, while 20 results are characterized as faulty.

Figure 11B:
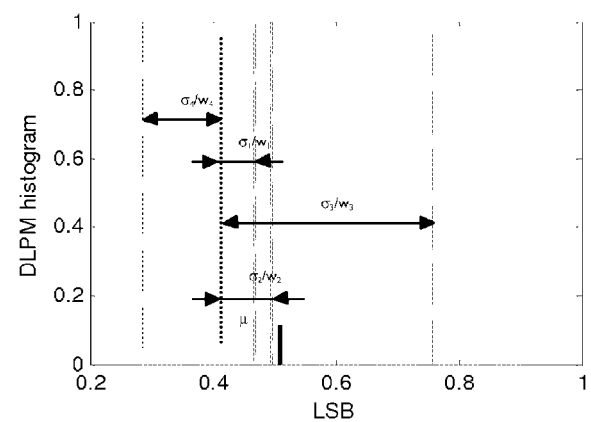
Figure 12:
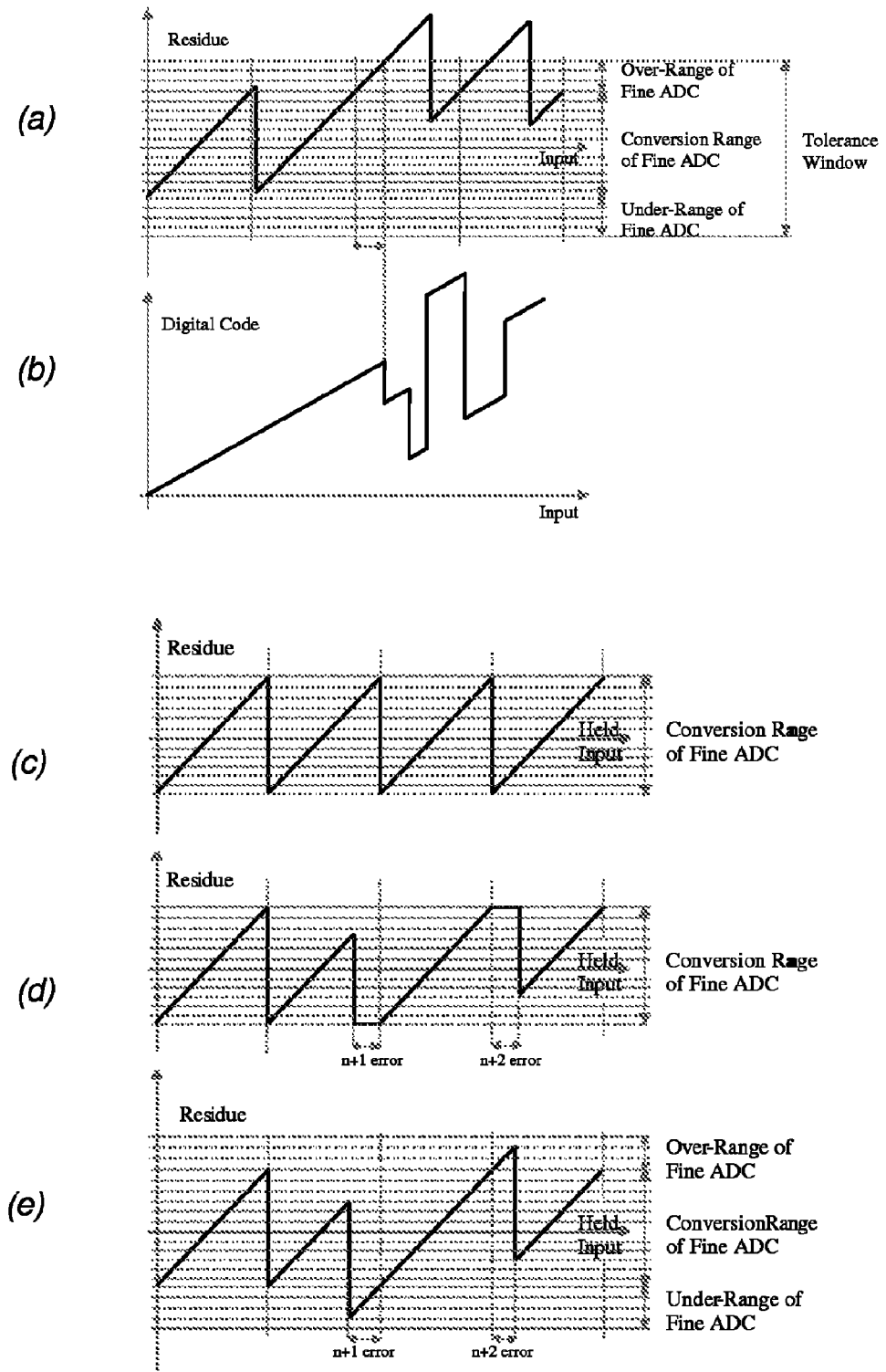
FIGS. 12a to 12e are used to explain the operation of the embedded test circuits.

Taking three random "pass" DLPMs and a failing one, this can be assumed to be the four measurements of one set of DLPMs, as shown in FIG. 11b. In practice, repetitive single-DLPM measurements are performed to minimize noise errors and the number of measurements depends upon the test time budget. Each measurement is weighted depending upon the DLPM spatial position and its corresponding matching structure in the circuit under test. In general, it holds that measurements of DLPMs spatially closer to their matching structures have a greater weight than measurements of other non matching DLPMs. In other words, the farther the structure from its matching DLPM is, the lower the assigned weight is.

The chances that the devices are faulty is evaluated from the summation of the weighted variances of these measurements with respect to the expected mean value as:

$$-\frac{V_{FS}}{2^{N+1}} G^{i-1} \leq \sigma^2_{w\_total} = \frac{1}{N_m} \sum_{n_m=1}^{N_m} \frac{\sigma^2_{w_{n_m}}}{w_{n_m}} \leq \frac{V_{FS}}{2^{N+1}} G^{i-1} \quad (4)$$

for $N_m$ number of measurements and N bit resolution.

In FIG. 11b, the mean value μ extracted from FIG. 11a is shown, and the weighted sigmas of each measurement and their relative position to the actual test limits. A device is regarded as "probably faulty" if it falls outside the limits given by equation (4).

Typical circuit design is based on worst-case process variability conditions to ensure circuit functionality in various process corners. This has as drawback that the circuit is big, is power hungry and it is much more difficult to reach the desired specs. Thus, it would be better to choose simply a more "relaxed" design condition. Statistical data extracted through the DLPM measurements allows characterization of the current process variability conditions (process corners) of certain parameters of interest, enabling the optimized design environment.

Similarly, as shown in FIG. 11a, for the particular process and design there is a yield fall off because of a shift of the process related LSB window. This process related information allows design re-centering based upon the most failing DLPMs.

On the fly test limit setting is also possible from statistical DLPM data. For instance, if an actually measured parameter distribution is known, the high and low limit values can be updated in the corresponding functional test specs of the device under test leading to the increased yield.

The decision of whether a device is good or faulty is made according to how the references are defined, so it is of utmost importance to define the references properly. The reference definitions are different for different parts of the DUT (the multi-stage ADC) and for different DLPMs. The issues surrounding the selection of reference values, for the specific example above of a coarse-fine ADC, will be discussed below.

The input-referred error $e_{in}$, that is equivalent to the contributions of all the individual error sources is:

$$e_{in} = e_1 + \sum_{i=1}^{k-1} \frac{e_{i+1}}{G^i} \text{ with } e_i \leq \frac{V_{FS}}{2^{N+1}} G^{i-1} \quad (5)$$

which is the limit of the ADC error arising from each error source to less than ½LSB, where k is the number of the stages i, $V_{FS}$ is full scale input signal and G is the gain of the stage.

Decision stage offset of the coarse and fine ADC moves the coarse and fine ADC decision levels. If the correction range is not exceeded by the combination of all errors that shift the coarse ADC decision levels, the effect of the coarse ADC decision stage offset is eliminated by the digital correction. An offset on the residue amplifier gives a DC shift of the fine ADC reference with respect to the coarse ADC and DAC range. The non-compensated remaining offset at the input of each ADC comparator due to the decision stage offset is given by $$V_{off|NC}^D = \frac{V_{off}^D}{G^{i-1}} \quad (6)$$

where $V_{off|NC}^D$ is the input referred non-compensated offset, $V_{off}^D$ is the decision stage offset, and $G^{i-1}$ is the gain of the preceding stage. Imposing a ±½LSB maximum deviation leads to the definition of the comparison window:

$$\Delta V = G^i V_{off}^C \Rightarrow -\frac{V_{FS}}{2^{N+1}} G^i G^{i-1} \leq \Delta V \leq \frac{V_{FS}}{2^{N+1}} G^i G^{i-1} \quad (7)$$

where $G^i$ is the gain of the decision stage-based DLPM.

The stage gain error in the S/H and residue amplifier can be combined into one equivalent error that is very critical to linearity. A gain error in the residue amplifier scales the total range of residue signal (signal as a result of the subtraction of the input signal and the DAC signal) and causes an error in the analog input to the next stage when applied to any nonzero residue, which will result in residue signal not fitting in the fine ADC range. If the error in the analog input to the next stage is more than one part in $2^r$ (where r is the resolution remaining after the inter-stage gain error), it will result in a conversion error that is not removed by digital correction. Since all nonzero residues are affected by inter-stage gain errors, the conversion-range boundary has no special significance from a gain-error standpoint. Dual-residue signal processing spreads the errors of the residue amplifiers over the whole fine range, which results in an improved linearity.

An error in the range of the fine ADC results in an error similar to a residue amplifier gain error. The gain of the sub-tractor and amplifier should therefore be lined with the fine ADC range. The input of fine ADC is $$V_{fine} = G(1+\sigma_i)R = GR + G\sigma_i R \quad (8)$$

where R is the residue signal, G is the gain and $\sigma_i$ is fractional gain error of residue amplifier. To limit resulting nonlinearity to ±½LSB $$|G\sigma_i R| \leq \frac{V_{FS}}{2^{N+1}} G^{i-1} \quad (9)$$

The error in residue amplifier is proportional to G×R, thus, the effect of the gain error is largest when G×R is maximum. Using the entire conversion range, the minimum allowable gain error is $$-\frac{V_{FS}}{2} \leq G \times R \leq \frac{V_{FS}}{2} \quad (10)$$

$$|\sigma_i|_{min} \leq \frac{G^{i-1}}{2^N}$$

If the correction range is not exceeded by the combination of all errors that shift the coarse ADC decision levels, the effect of the DAC gain error in series with the coarse ADC is eliminated by the digital correction. The two remaining gain errors contribute inter-stage gain errors, which have the same effect on ADC linearity as the residue amplifier gain errors.

Linearity in the coarse ADC and fine ADC is limited by reference ladder and preamplifier offset, gain mismatch of preamplifiers and non-linearity of preamplifiers, which shift the decision by $\Delta V$. All these sources of errors can be modelled by decision stage offset voltage errors, stage gain errors and errors in the internal reference voltages, whose comparison window is given by:

$$\left. \begin{array}{l} \Delta V_{|max} = V_{FS} \dfrac{\Delta R}{\sum_{j=1}^{N} R_j} \\ \Delta V = I_{ref} \Delta R \end{array} \right\} \Rightarrow -\dfrac{I_{ref} \sum_{j=1}^{N} R_j}{2^{N+1}} \leq \Delta V \leq \dfrac{I_{ref} \sum_{j=1}^{N} R_j}{2^{N+1}} \quad (11)$$

where $I_{ref}$ is the reference current in the resistor ladder DLPM, $V_{FS}$ is the full scale of the converter, $R_j$ is the value of each resistor in the resistor ladder, and N is the total number of resistor in the ladder.

The effect of coarse ADC nonlinearity is studied by examining plots of the ideal residue versus the input in FIG. 13(a), residue versus input with coarse ADC nonlinearity in FIG. 13(b), and residue versus input with coarse ADC nonlinearity error when over-range is applied in FIG. 13(c).

In FIG. 13(a), both the coarse ADC and the DAC are assumed to be ideal. When the input is between the decision levels determined by the coarse ADC, the coarse ADC and DAC outputs are constant; therefore, the residue rises with the input.

FIG. 13(d) shows the coarse ADC and DAC transfer characteristics in the presence of a fault and FIG. 13(e) shows the faulty digitally corrected ADC transfer characteristic When the input crosses a decision level, the coarse ADC and DAC outputs increase by 1LSB at a 2-bit level, so the residue decreases by the digital value of conversion range of fine ADC. When the coarse ADC has some nonlinearity, with DAC still ideal, as shown in FIG. 13(b) for a similar example, two of the coarse ADC decision levels are shifted, one by −1½LSB (n+1 error) and the other by +2LSB (n+2 error). When the input crosses a shifted decision level, the residue decreases by digital value of conversion range of fine ADC. If the conversion range of the second stage is increased to handle the larger residues, they can be encoded and the errors corrected (FIG. 13(c)). This process is called digital correction.

By adding over-range to the fine ADC the accuracy requirements of the coarse ADC is reduced significantly.

However, since the output of the fine ADC is not corrected, coarse ADC errors there do cause ADC nonlinearity but in amount that is diminished by the combined inter-stage gain before fine ADC. DAC transfer characteristic in the presence of fault is illustrated in FIG. 13(d); note that the fault provokes over-range and level shifting errors. Processing these data with the rest of the ADC, including the correction logic is shown in FIG. 13(e).

Digital correction does not mask all errors produced by the fault, and hence the circuit is faulty: on the other hand, since the window comparator threshold has been exceeded the fault is also a "detected fault". The references of the DAC and the subtraction of the input signal and the DAC output determine the achievable accuracy of the total ADC. The residue signal R is incorrect exactly by the amount of the DAC nonlinearity $$R = GV_{in} - DAC_{out} - \delta_i \quad (12)$$

where $DAC_{out}$ is the ideal output of the DAC, G is the gain and $\delta_i$ is DAC nonlinearity error. To limit the resulting non-linearity to less than ½ LSB, $$|\delta_i|_{min} \le \frac{V_{FS}}{2^{N+1}} \quad (13)$$

The linearity of the fine ADC determines the overall achievable linearity of the ADC. However, since the residue amplifier provides gain, the linearity requirements are reduced by this gain factor. An error in this quantization increases the DNL of the total ADC.

The sensors are preferably formed of circuits which replicate circuits of the device under test, namely using the same components (i.e. same device types made from the same layers) and using circuit layouts which at least partially replicate the circuit portions of the DUT. However, the sensors may be different to the DUT if the differences can be modelled, so that responses of the sensors can be mapped to expected responses of the DUT. The sensors may comprise simple transistor circuits, and the monitoring results can then be used to calculate the effect of the observed process variations on the DUT.

One detailed analysis has been given above for a coarse-fine ADC, but it will be appreciated that the invention can be applied to any device under test.

Various other modifications will be apparent to those skilled in the art.

The invention claimed is:

1. An integrated circuit comprising a device under test and embedded test circuitry, wherein the embedded test circuitry comprises:
   a plurality of process monitoring sensors;
   a threshold circuit for comparing the sensor signals with a threshold window having an upper and a lower limit;
   a digital interface for outputting the threshold circuit signal,
   wherein the process monitoring sensors include one or more circuit elements respectively representing circuit elements of the device under test to monitor electrical behavior of the device under test by testing the one or more circuit elements.

2. A circuit as claimed in claim 1, further comprising at least one amplifier for amplifying the sensor signals; and
   wherein the one or more circuit elements of the process monitoring sensors include one or more transistors that are tested by the process monitoring sensors to determine process parameter variations of the one or more transistors.

3. A circuit as claimed in claim 1, wherein the sensors are embedded into the integrated structure of the device under test and/or provided around the periphery of the device under test.

4. A device as claimed in claim 1, wherein the sensors are for monitoring process parameter variations.

5. A device as claimed in claim 1, wherein the embedded test circuitry comprises digital control logic for interface to external test circuitry, the digital control logic accessing a scan chain of the embedded test circuitry.

6. A device as claimed, in claim 1, wherein the process monitoring sensors are driven independently of the device under test.

7. A device as claimed in claim 6, wherein the process monitoring sensors are not functionally connected to the device under test.

8. A device as claimed in claim 1, wherein the digital interface provides sampling and digitization of the threshold circuit signal.

9. A device as claimed in claim 1 comprising at least one amplifier for amplifying the sensor signals, wherein the process monitoring sensors, the at least one amplifier and the threshold circuit each include one or more circuit elements in the same arrangement as one or more comprise circuitry based on and the circuit elements of the device under test.

10. The device of claim 1, wherein the one or more circuit elements match the physical layout of the similar circuit elements of the device under test.

11. The device of claim 2, wherein the one or more circuit elements respectively represent one or more elements of the device under test for which process calibration is required.

12. A method of testing an integrated circuit, comprising analysing embedded test circuitry associated with a device under test, wherein the embedded test circuitry comprises a plurality of process monitoring sensors which include one or more circuit elements respectively representing circuit elements of the device under test, a threshold circuit for comparing the sensor signals with a threshold window having an upper and a lower limit, a digital interface for outputting the threshold circuit signal,
   wherein the method comprises monitoring process parameter variations using the embedded test sensors independently of the operation of the device under test.

13. The method of claim 12, wherein the threshold window is tunable to allow extraction of different process parameter information.

14. The method of claim 12, further comprising, performing process calibration for the respective similar circuit elements of the device under test using the monitored process parameter variations.

* * * * *